United States Patent
Schaefer et al.

(10) Patent No.: US 11,443,137 B2
(45) Date of Patent: Sep. 13, 2022

(54) METHOD AND APPARATUS FOR DETECTING SIGNAL FEATURES

(71) Applicant: Rohde & Schwarz GmbH & Co. KG, Munich (DE)

(72) Inventors: Andrew Schaefer, Oberhaching (DE); Baris Guezelarslan, Ottobrunn (DE); Benjamin Fischbach, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 669 days.

(21) Appl. No.: 16/528,317

(22) Filed: Jul. 31, 2019

(65) Prior Publication Data

US 2021/0034918 A1   Feb. 4, 2021

(51) Int. Cl.
G06K 9/62 (2022.01)
H03M 1/10 (2006.01)
G06N 3/08 (2006.01)

(52) U.S. Cl.
CPC ......... *G06K 9/6256* (2013.01); *G06K 9/6239* (2013.01); *G06N 3/088* (2013.01); *H03M 1/1071* (2013.01)

(58) Field of Classification Search
CPC   G06N 3/0454; G06N 3/084; G10L 2015/025; G10L 15/142
See application file for complete search history.

(56) References Cited

U.S. PATENT DOCUMENTS

| | | | | |
|---|---|---|---|---|
| 7,471,724 B2* | 12/2008 | Lee | ......................... | H04N 19/63 |
| | | | | 375/E7.113 |
| 7,738,121 B2* | 6/2010 | Spalding | .............. | G01B 11/245 |
| | | | | 356/639 |
| 7,812,970 B2* | 10/2010 | Nygaard | .................. | G01S 17/48 |
| | | | | 356/602 |
| 7,933,770 B2* | 4/2011 | Kruger | .................... | G10L 19/12 |
| | | | | 704/219 |
| 8,378,608 B2* | 2/2013 | Robertson | ........... | H02M 5/4505 |
| | | | | 318/729 |

(Continued)

FOREIGN PATENT DOCUMENTS

| CA | 3022907 A1 | 11/2017 |
|---|---|---|
| CA | 108737406 A | 11/2018 |

(Continued)

OTHER PUBLICATIONS

Wen Tingxi et al., "Deep Convolution Neural Network and Autoencoders-Based Unsupervised Feature Learning of EEG Signals", IEEE Access Journal, DOI: 10.1109/ACCESS.2018.2833746, vol. 6, dated May 7, 2018, 12 pages.

*Primary Examiner* — Yosef Kassa
(74) *Attorney, Agent, or Firm* — Westman, Champlin & Koehler, P.A.

(57) ABSTRACT

A measurement apparatus comprising an acquisition memory adapted to store data sections of at least one acquired measurement signal; a processor adapted to calculate a measurement parameter vector, v, for each data section of the acquired measurement signal; and a trained autoencoder neural network adapted to process the measurement parameter vectors, v, applied as input data to the trained autoencoder neural network to provide at a middle layer of said autoencoder neural network an encoded vector, h, with characteristic signal features of the acquired measurement signal.

17 Claims, 4 Drawing Sheets

(56) References Cited

U.S. PATENT DOCUMENTS

| | | |
|---|---|---|
| 8,396,546 B2 * | 3/2013 | Hirata .................... A61B 5/318 600/545 |
| 10,303,971 B2 | 5/2019 | Geva et al. |
| 10,460,213 B2 | 10/2019 | Kang et al. |
| 10,664,754 B2 | 5/2020 | Gotou |
| 2016/0358074 A1 | 12/2016 | Latapie et al. |
| 2017/0046616 A1 | 2/2017 | Socher et al. |
| 2017/0068888 A1 | 3/2017 | Chung et al. |
| 2017/0328194 A1 | 11/2017 | Liu et al. |
| 2018/0053085 A1 | 2/2018 | Matsumoto et al. |
| 2018/0137941 A1 | 5/2018 | Chen |
| 2018/0150746 A1 | 5/2018 | Tu et al. |
| 2018/0157937 A1 | 6/2018 | Kang et al. |
| 2018/0164757 A1 | 6/2018 | Matsushima et al. |
| 2018/0247200 A1 | 8/2018 | Rolfe |
| 2018/0247201 A1 | 8/2018 | Liu et al. |
| 2018/0253640 A1 | 9/2018 | Goudarzi et al. |
| 2018/0268297 A1 | 9/2018 | Okazaki et al. |
| 2018/0276817 A1 | 9/2018 | Isgum et al. |
| 2018/0300609 A1 | 10/2018 | Krishnamurthy et al. |
| 2018/0314917 A1 | 11/2018 | Mehr et al. |
| 2018/0322394 A1 | 11/2018 | Nguyen et al. |
| 2018/0322537 A1 | 11/2018 | Driemeyer et al. |
| 2018/0328967 A1 | 11/2018 | Lange et al. |
| 2018/0374089 A1 | 12/2018 | Duboue |
| 2019/0012581 A1 | 1/2019 | Honkala et al. |
| 2019/0012774 A1 | 1/2019 | Arai |
| 2019/0026631 A1 | 1/2019 | Carr et al. |
| 2019/0034802 A1 | 1/2019 | Harshangi et al. |
| 2019/0034803 A1 | 1/2019 | Gotou |
| 2019/0050395 A1 | 2/2019 | Min |
| 2019/0073443 A1 | 3/2019 | Frey et al. |
| 2019/0073594 A1 | 3/2019 | Eriksson et al. |
| 2019/0095798 A1 | 3/2019 | Baker |
| 2019/0124045 A1 | 4/2019 | Zong et al. |
| 2020/0034670 A1 | 1/2020 | Kang et al. |
| 2020/0090042 A1 | 3/2020 | Wayne et al. |

FOREIGN PATENT DOCUMENTS

| | | |
|---|---|---|
| CN | 104361328 A | 2/2015 |
| CN | 104834941 A | 8/2015 |
| CN | 104866727 A | 8/2015 |
| CN | 106203624 A | 12/2016 |
| CN | 108062572 A | 5/2018 |
| CN | 108256629 A | 7/2018 |
| CN | 108304927 A | 7/2018 |
| CN | 108347764 A | 7/2018 |
| CN | 108460391 A | 8/2018 |
| CN | 108491431 A | 9/2018 |
| DE | 102018005652 A1 | 1/2019 |
| EP | 3396603 A1 | 10/2018 |
| GB | 201710877 | 8/2017 |
| KR | 101836096 B1 | 3/2018 |
| KR | 20180063869 A | 6/2018 |
| WO | 2016194248 A1 | 12/2016 |
| WO | 2017031356 A1 | 2/2017 |
| WO | 2017125980 A1 | 7/2017 |
| WO | 2017133188 A1 | 8/2017 |
| WO | 2018204781 A1 | 11/2018 |
| WO | 2018211140 A1 | 11/2018 |
| WO | 2018220368 A1 | 12/2018 |

* cited by examiner

METHOD AND APPARATUS FOR DETECTING SIGNAL FEATURES

TECHNICAL FIELD

The invention relates to a method and apparatus for detecting signal features of a measurement signal and in particular to a method and apparatus to provide unsupervised signal characterization using autoencoding.

TECHNICAL BACKGROUND

When recording large amounts of data, in particular measurement data, either as a single, long acquisition or recording large amounts of short acquisitions (or anywhere in-between), it can be a very time-consuming task to process the recorded data to extract useful information about the measurement signal. Conventional signal analysis can use search functions or use a mask trigger on historic data in order to filter out particular properties of acquired waveforms of the measurement signal. One can generally detect predefined signal features such as signal integrity defects. Further, it is possible to rely on training data and knowledge about expected important features. These conventional signal analyzing methods require some form of a priori knowledge or input of what to look for in an acquired measurement signal. However, in many use cases such kind of a priori knowledge is not available. Accordingly, there is a need to provide a method and system which allows to detect signal features within a measurement signal without any prior knowledge about expected signal features.

SUMMARY OF THE INVENTION

The invention provides according to a first aspect a method for detecting signal features of a measurement signal comprising the steps of:
  providing at least two separate data sections of at least one measurement signal,
  determining a measurement parameter vector for each provided data section of the measurement signal and
  processing the measurement parameter vectors as input data by a trained autoencoder neural network to detect signal features of said measurement signal.

In a possible embodiment of the method according to the first aspect of the present invention, an encoded vector including a number of characteristic signal features of the measurement signal is derived from a middle layer of said trained autoencoder neural network.

In a further possible embodiment of the method according to the first aspect of the present invention, a dimension of an output encoded vector of said autoencoder neural network comprising a number of characteristic signal features derived from the middle layer of said autoencoder neural network is reduced to provide a vector in a feature space with lower dimension.

In a further possible embodiment of the method according to the first aspect of the present invention, the measurement signal is derived by a measurement apparatus from a device under test.

In a further possible embodiment of the method according to the first aspect of the present invention, characteristics of data sections of the measurement signal represented in the low dimensional feature space are displayed on a screen of a user interface of said measurement apparatus.

In a further possible embodiment of the method according to the first aspect of the present invention, data sections of the measurement signal comprising similar signal features in the low dimensional feature space are clustered to determine feature areas of similar data sections displayed on the screen of the user interface of said measurement apparatus.

In a further possible embodiment of the method according to the first aspect of the present invention, a first kind of label is assigned to each determined feature area.

In a still further possible embodiment of the method according to the first aspect of the present invention, a second kind of label is assigned to the data section of the measurement signal based on the at least one determined feature area.

In a further possible embodiment of the method according to the first aspect of the present invention, the measurement signal comprises an analog measurement signal acquired by a probe of a measurement apparatus digitized and stored in an acquisition memory of the measurement apparatus.

In a further possible embodiment of the method according to the first aspect of the present invention, the digital measurement signal stored in the acquisition memory of said measurement apparatus is segmented into data sections processed to determine a measurement parameter vector for each data section.

In a still further possible embodiment of the method according to the first aspect of the present invention, the autoencoder neural network is trained in an unsupervised machine learning process on the basis of applied measurement parameter vectors.

The invention further provides according to a second aspect a measurement apparatus comprising
  an acquisition memory adapted to store data sections of at least one acquired measurement signal,
  a processor adapted to calculate a measurement parameter vector for each data section of the acquired measurement signal and
  a trained autoencoder neural network adapted to process the measurement parameter vectors applied as input data to the trained autoencoder neural network to provide at a middle layer of said autoencoder neural network an encoded vector with characteristic signal features of the acquired measurement signal.

In a possible embodiment of the measurement apparatus according to the second aspect of the present invention, the measurement apparatus comprises at least one probe to derive at least one analog measurement signal from a device under test applied to an analog to digital converter adapted to convert the analog measurement signal into a digital signal comprising data sections stored in the acquisition memory of said measurement apparatus.

In a possible embodiment of the measurement apparatus according to the second aspect of the present invention, the trained autoencoder neural network comprises a variational autoencoder neural network.

In a further possible embodiment of the measurement apparatus according to the second aspect of the present invention, the trained autoencoder neural network comprises an adversarial autoencoder neural network.

In a further possible embodiment of the measurement apparatus according to the second aspect of the present invention, the measurement apparatus comprises a signal analyzer, in particular an oscilloscope.

The invention further provides according to a further aspect a computer-implemented method for signal feature detection within at least one measurement signal,
  wherein measurement parameter vectors representing separate data sections of the measurement signal are processed by a trained autoencoder neural network to detect automatically characteristic signal features of the measurement signal displayed on a display of a user interface.

The invention further provides according to a further aspect a computer-implemented software tool for signal feature detection in one or more measurement signals by processing separate data sections of each measurement signal to calculate associated measurement parameter vectors applied as input data to a trained autoencoder neural network to extract characteristic signal features of the measurement signals.

The invention provides according to a further aspect a computer program product which stores the computer-implemented software tool.

BRIEF DESCRIPTION OF FIGURES

In the following, possible embodiments of the different aspects of the present invention are described in more detail with reference to the enclosed figures.

DETAILED DESCRIPTION OF EMBODIMENTS

Figure 1:
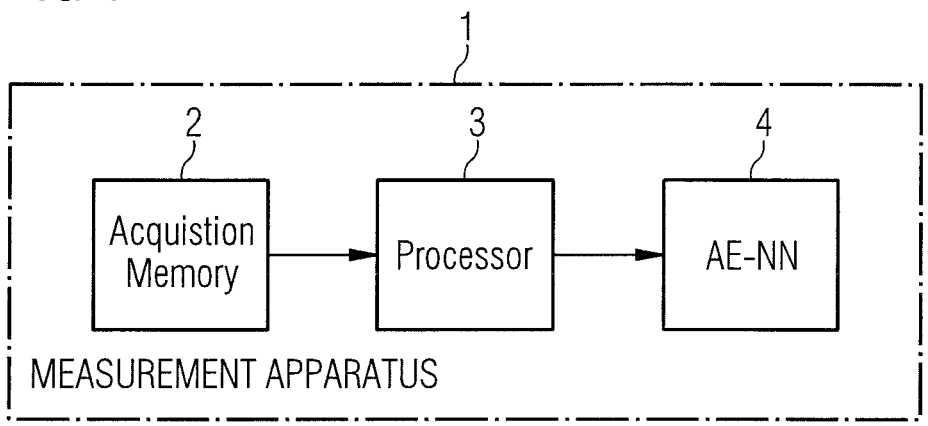
FIG. 1 shows a block diagram of an exemplary embodiment of a measurement apparatus according to the present invention.

FIG. 1 shows a block diagram of a possible exemplary embodiment of a measurement apparatus 1 according to an aspect of the present invention. As can be seen in the block diagram of FIG. 1, the measurement apparatus 1 comprises an acquisition memory 2, a processor 3 and a trained autoencoder neural network 4. The acquisition memory 2 of the measurement apparatus 1 is adapted to store data sections of at least one acquirement measurement signal. The processor 3 has access to the acquisition memory 2 and is adapted to calculate a measurement parameter vector v for each data section of the acquired measurement signal. The trained autoencoder neural network 4 is adapted to process the received measurement parameter vectors v applied as input data to the trained autoencoder neural network 4 to provide at a middle layer an encoded vector h with characteristic signal features of the acquired measurement signal.

The autoencoder neural network 4 has been trained based on n measurement parameter vectors. In a possible embodiment, at least n data sections of the acquired measurement signal are stored in the acquisition memory 2, wherein n 2. A data section can comprise a segment or portion of a long acquisition waveform representing the measurement signal.

In a possible embodiment, a set of n measurement parameter vectors, one for each data section, is determined and applied to the autoencoder neural network 4 for training purposes. The autoencoder neural network 4 can be trained in a training phase in a machine learning process.

After training and testing has been completed, the trained autoencoder neural network 4 of the measurement apparatus 1 is adapted to calculate an encoded vector h with characteristic signal features for each new acquired measurement signal measured by the measurement apparatus 1. Once the autoencoder neural network 4 has been trained, the function values of the middle layer can be determined for each member of an input set. This can be used for visualization of core parameters of the measurement signal or as input to a clustering algorithm for automatic grouping. In a possible embodiment, a reconstruction error can be used to train the internal parameters of the different layers of the autoencoder neural network 4 such that the system learns the best possible compressed representation (encoded vector at the middle layer) of an applied measurement parameter vector v. Autoencoding involves the training of the different layers of the autoencoder neural network 4 to compress an input and then reconstruct the original input from the compressed version in a most accurate way. The reconstruction essentially forces the autoencoder to learn a best possible compression or in other words to learn the most important features. Autoencoding is completely data-dependent and requires no labeling of the input data. In a training phase, the autoencoder neural network 4 does learn the main features of an applied input dataset learning its neural network parameters. For each member of the input set, the values of each of these features can be determined, e.g. by applying a compression stage to each member of the input set. The parameters can be either visualized (e.g. with a scatter plot) or clustering algorithms can be applied to automatically determine groups having similar parameters. Consequently, groups with similar parameters become automatically obvious, i.e. visible to a user. Further, also rare events within the measurement signal also become automatically evident to the operator.

In a preferred embodiment, a dimension of the encoded vector h output by the trained autoencoder neural network 4 and comprising a number of characteristic signal features is reduced automatically to provide a vector h' in a feature space with lower dimension. This can be achieved in a possible embodiment by a t-distributed Stochastic Neighbor Embedding process (T-SNE). In a possible embodiment, n measurement parameter vectors v are applied to the trained autoencoding neural network 4 to determine k signal features per each data section. In a possible embodiment, the dimension of the k signal features are reduced to a 1 dimensional feature space (wherein 1<k). In a possible embodiment, the 1 dimensional feature space is displayed on a screen of a user interface 11 of the measurement apparatus 1 as also shown in FIG. 2.

Characteristics of data sections of the measurement signal represented in the low dimensional feature space are displayed on the screen of the user interface 11 of the measurement apparatus 1, e.g. oscilloscope or signal analyzer. In a possible embodiment, the data sections of the measurement signal comprising similar signal features in a low dimensional feature space are clustered to determine feature areas of similar data sections displayed on the screen of the user interface 11 of the measurement apparatus 1. In a possible embodiment, a first kind of labels can be assigned for each determined feature area. Further, a second kind of label can be assigned to the data section of the measurement signal based on the at least one determined feature area. The trained autoencoder neural network 4 of the measurement apparatus 1 can be used to classify an input measurement signal derived from a device under test DUT. Accordingly, the autoencoder neural network 4 can be used to classify any new measurement signal for which features are not known which could lead to results in the 1 dimensional feature space being inside the known areas or outside. An outside case could mean that a new training of the autoencoder neural network 4 becomes necessary. In a possible embodiment, the measurement apparatus 1 as illustrated in FIG. 1 can comprise a probe 6 as shown in FIG. 2 to derive at least one analog measurement signal from a device under test DUT such as a printed circuit board PCB and an analog to digital converter 7 adapted to convert the analog measurement signal into a digital signal comprising data sections stored in the acquisition memory 2 of the measurement apparatus 1. The autoencoder neural network 4 can comprise in a possible embodiment a variational autoencoder neural network. In an alternative embodiment, the autoencoder neural network 4 of the measurement apparatus 1 can also comprise an adversarial autoencoder neural network. The digital measurement signal stored in the acquisition memory 3 can be segmented into data sections processed to determine a measurement parameter vector v for each data section. The measurement parameter vectors v can be applied as input data to an input layer of the trained autoencoder neural network 4 to generate an encoded vector h with characteristic signal features of the acquired measurement signal. In a possible embodiment, the encoded signal vector h is further processed to reduce its dimension. Characteristics of data sections of the measurement signal represented in the low dimensional feature space are then displayed on a screen of the user interface 11 of the measurement apparatus 1. Consequently, different data sections of the measurement signal are visualized so that groups with similar parameters become automatically evident to the technician.

Figure 2:
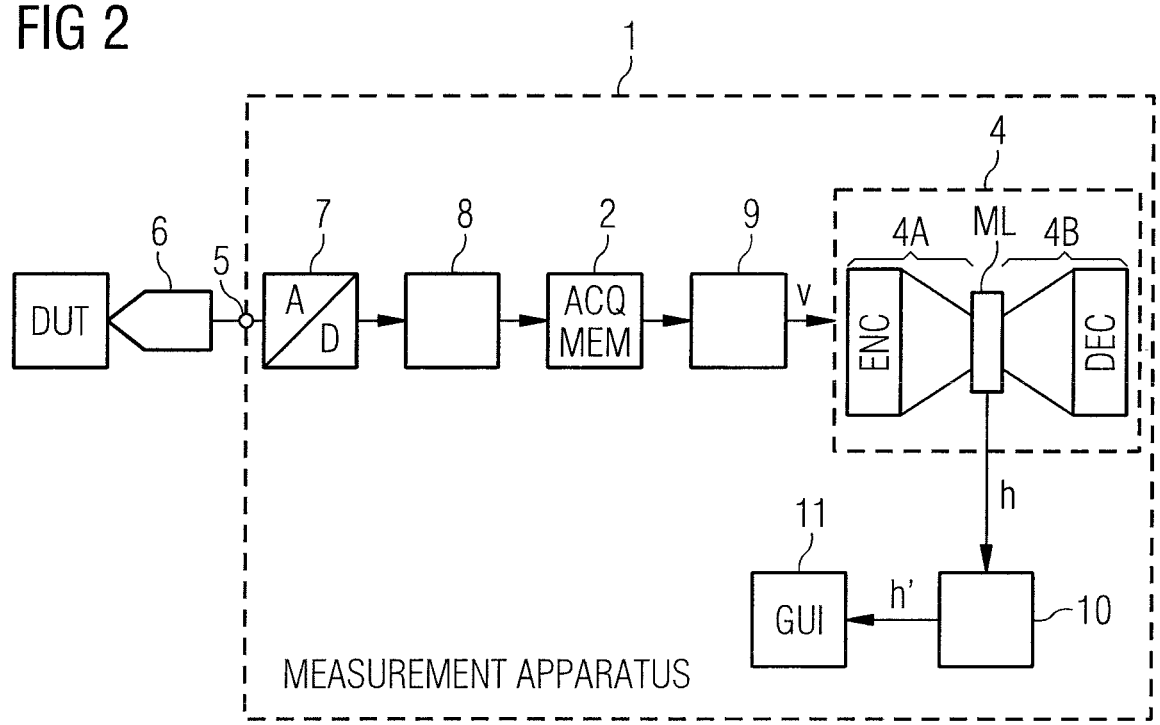
FIG. 2 shows a block diagram of a further exemplary embodiment of a measurement apparatus according to the present invention.

FIG. 2 shows a possible exemplary embodiment of a measurement apparatus 1 according to an aspect of the present invention. The measurement apparatus 1 comprises in the illustrated block diagram a signal input port 5 to which a sensor or probe 6 can be connected. The probe 6 is adapted to derive an analog measurement signal from a device under test DUT. The analog measurement signal is applied to an analog to digital converter 7 which converts the received analog measurement signal into a digital measurement signal. The digital measurement signal generated by the analog to digital converter 7 can be further processed by a signal preprocessing unit 8 of the measurement apparatus 1. In a possible embodiment, the digital measurement signal stored in the acquisition memory 2 of the measurement apparatus 1 is segmented into data sections processed by a further processing stage 9 to determine a measurement parameter vector v for each data section of the digital measurement signal. The trained autoencoder 4 is adapted to process the received measurement parameter vectors v applied as input data to the trained autoencoder neural network 4 to provide at a middle layer an encoded vector h comprising characteristic signal features of the acquired measurement signal. In a further processing stage 10, the encoded vector h output by the autoencoder neural network 4 is further processed to reduce its dimension, for instance by applying a t-distributed Stochastic Neighbor Embedding algorithm. The dimension of the encoded vector h output by the autoencoder neural network 4 is reduced to provide a vector h' in a feature space with lower dimension. Characteristics of the data sections of the measurement signal represented in the low dimensional feature space can be displayed on a screen of a user interface 11 of the measurement apparatus 1. In a possible embodiment, data sections of the measurement signal comprising signal features in the low dimensional feature space can be clustered to determine feature areas of similar data sections displayed on the screen of the user interface 11 of the measurement apparatus 1. The determined feature areas can be labeled in a possible embodiment.

Figure 3:
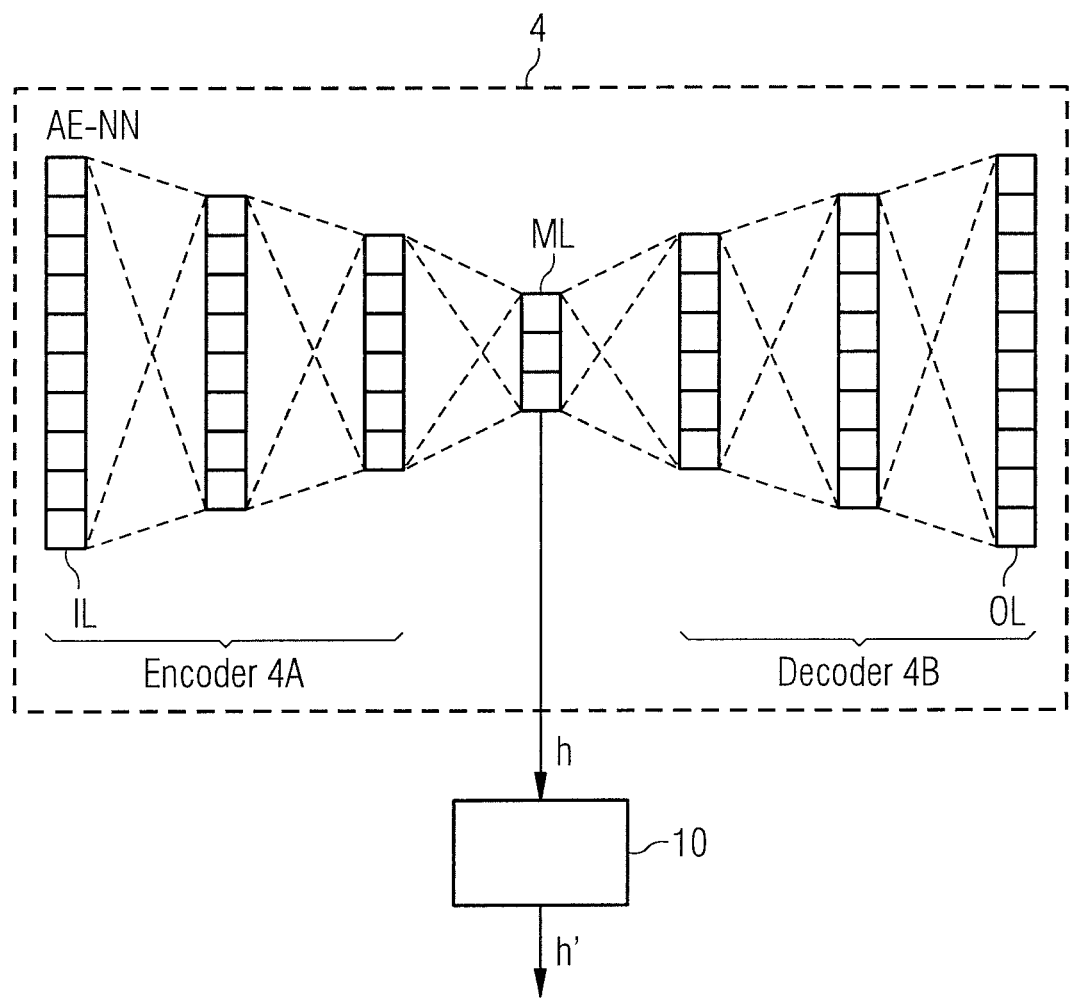
FIG. 3 shows a schematic diagram for illustrating a possible exemplary embodiment of an autoencoder neural network implemented in a measurement apparatus according to the present invention.

FIG. 3 shows schematically a possible implementation of an autoencoder neural network 4 used in the measurement apparatus 1 according to the present invention. In the illustrated embodiment, the autoencoder neural network 4 comprises an encoder 4A and a decoder 4B. The encoder 4A maps the input data into the encoded vector h at the internal hidden layer HL in the middle (ML) of the autoencoder neural network 4. The decoder 4B is adapted to map the encoded vector h to a reconstruction of the original input. In a possible implementation, the autoencoder neural network 4 can be implemented as a feedforward non-recurrent neural network. The encoder 4A and the decoder 4B both comprise several layers L. The autoencoder neural network 4 comprises an input layer IL adapted to receive the measurement parameter vector v, an output layer OL and one or more hidden layers HL connecting them. The output layer OL has the same number of nodes or neurons as the input layer IL. When the autoencoder 4 reconstructs its input it minimizes the difference between the input and the output. The autoencoder 4 does not require labeled inputs for machine learning. The encoded vector has also referred to as the code provides a latent representation of the measurement signal. The autoencoder 4 receives the data at its input layer IL and propagates it to the middle layer ML and then reconstructs the same data (ideally) at the output layer OL. The encoded data at the middle layer ML of the autoencoder 4, i.e. the encoded vector h, comprises data with reduced dimensionality. This dimensionality can be further reduced in the processing stage 10 of the measurement apparatus 1 as also illustrated in FIG. 3. The number of layers L within the autoencoder 4 can vary depending on the implementation of the measurement apparatus 1.

Figure 4:
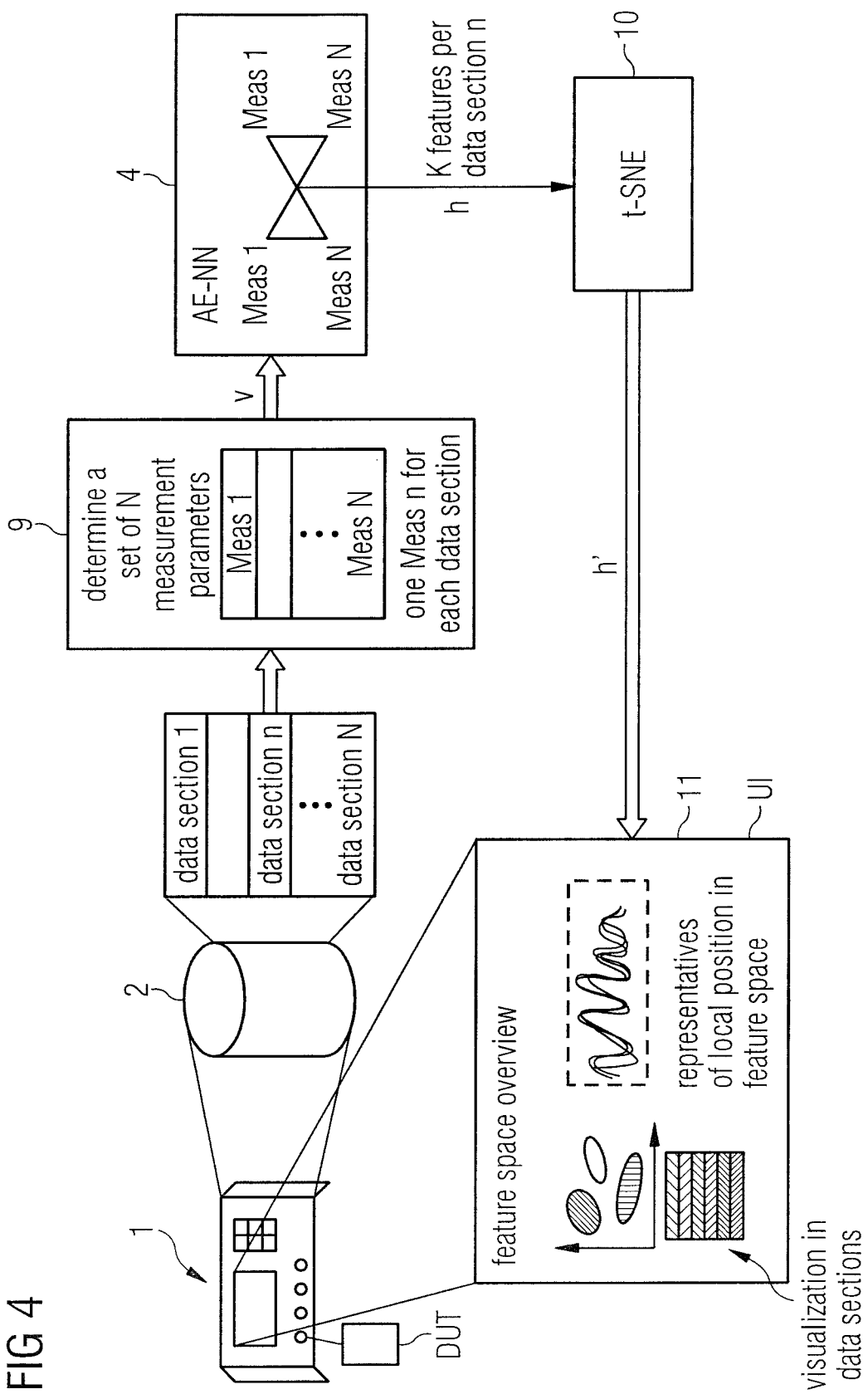
FIG. 4 shows a diagram for illustrating the operation of a measurement apparatus according to the present invention.

FIG. 4 illustrates the operation of a measurement apparatus 1 according to a possible embodiment of the present invention. The measurement apparatus 1 as illustrated in FIG. 4 can comprise an oscilloscope having several input ports 5 to receive measurement signals from one or more devices under test DUT. The measurement apparatus 1 comprises a graphical user interface 11 having a screen or display unit adapted to provide a feature space overview of the received measurement signal. The measurement apparatus 1 such as the oscilloscope shown in FIG. 4 can comprise an internal acquisition memory 2 as also illustrated in the block diagram of FIGS. 1 and 2. In a possible embodiment, the acquisition memory 2 can also comprise an external data storage such as a data carrier. In a further possible embodiment, the acquisition memory 2 can also comprise a remote memory or database connected to the measurement apparatus 1 via a network. Different data sections of the acquired measurement signal stored in the acquisition memory 2 can be processed in a possible embodiment to determine a set of N measurement parameters as illustrated in FIG. 4. Measurement parameters can be provided for each data section of the acquired measurement signal. In a training phase, the autoencoder neural network 4 can be trained providing k features per each data section. The dimensions of the k signal features can be reduced to a 1 dimensional feature space (1<k) by the processing stage 10 of the measurement apparatus 1. Characteristic signal features of the measurement signal can then be displayed on a display of the user interface 11 to visualize the different data sections or to provide representations of local positions in the feature space. Data sections having similar properties or behavior become automatically evident to the user of the measurement apparatus 1. Also, rare events expressed by the measurement signal become evident to the user.

Figure 5:
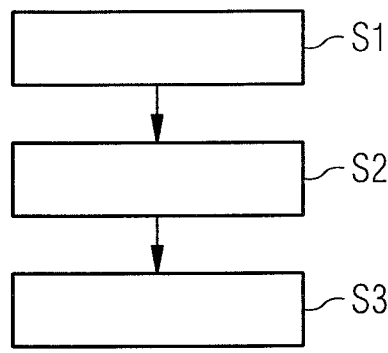
FIG. 5 shows a flowchart of a possible exemplary embodiment of a method for detecting signal features according to a further aspect of the present invention.

FIG. 5 shows a flowchart of a possible exemplary embodiment of a method for detecting signal features of a measurement signal.

In a first step S1, at least two separate data sections of a measurement signal are provided.

In a further step S2, a measurement parameter vector v for each provided data section of the measurement signal is determined or calculated.

In a third step S3, the measurement parameter vectors v are processed as input data by a trained autoencoder neural network 4 to detect signal features of the measurement signal.

In a further step (not illustrated in FIG. 5), the signal features are output via a user interface 11 of the measurement apparatus 1. Characteristics of data sections of the measurement signal represented in the low dimensional feature space can be displayed on a screen of the user interface 11 of the measurement apparatus 1. Data sections of the measurement signal comprising similar signal features in the low dimensional feature space can be clustered to determine feature areas of similar data sections displayed on the screen of the user interface 11 of the measurement apparatus 1. Each determined feature area can be labeled.

The method illustrated in FIG. 5 can be applied to different kinds of measurement signals. For instance, the method according to the present invention can be applied to a FFT waterfall diagram, wavelets, Gramian Angular Fields and/or to pulse's histograms (fingerprints).

Figure 6:
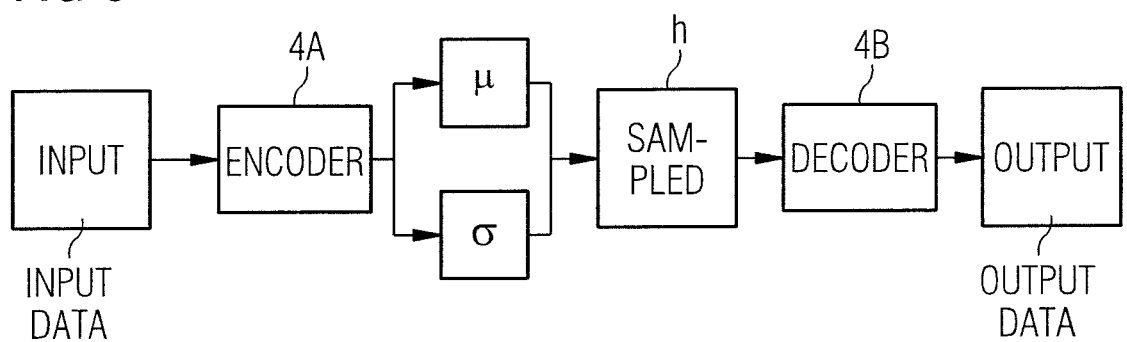
FIG. 6 shows a block diagram for illustrating a possible exemplary embodiment of an autoencoder neural network used in a measurement apparatus according to the present invention.

In a possible embodiment, the autoencoder neural network 4 can comprise a variational autoencoder neural network 4 as illustrated in FIG. 6. In the illustrated embodiment, the variational autoencoder encodes input data into two parts, i.e. a mean value $\mu$ and a standard deviation $\sigma$ of the process input data. The variational autoencoder creates a sampled encoding vector that is passed to the decoder 4B of the autoencoder neural network 4. While a conventional autoencoder 4 provides an encoded vector h that points to the encoded value in the latent feature space, the variational autoencoder 4 creates an output that points to an area where an encoded value can be.

Figure 7:
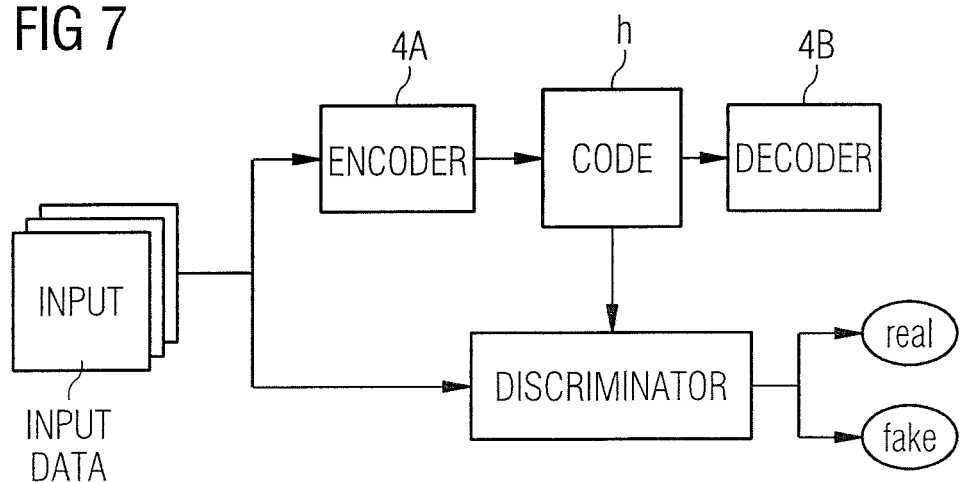
FIG. 7 shows a block diagram of a further exemplary embodiment of an autoencoder neural network used in a measurement apparatus according to the present invention.

In a further possible embodiment, the autoencoder neural network 4 can comprise an adversarial autoencoder architecture as illustrated in FIG. 7. The adversarial autoencoder uses prior distribution to control the encoder output. The encoded vector can be still composed of a mean value $\mu$ and a standard deviation $\sigma$ but prior distribution is used to model it. The encoder output is forced to follow a known distribution. Every kind of distribution can be used such as Gaussian distribution, gamma distribution or normal distribution, etc. The distribution of the encoded values is pushed into the direction of the prior distribution. The encoded value can be used as an input to a discriminator model as well as to the decoder 4B. In the machine learning process, first the generator model (encoder and decoder) is trained. The aim is to minimize the reconstruction loss. After that, it is proceeded with the training of the discriminator using both training data and encoded values of the autoencoder 4.

Different kinds of autoencoder neural networks 4 can be implemented in the measurement apparatus 1 for different applications.

In a further possible embodiment, the measurement apparatus 1 can switch between different types of autoencoder neural networks 4 trained for different purposes. These trained autoencoder neural networks 4 can be connected in parallel between the processing stage 9 and the processing stage 10 of the measurement apparatus 1 illustrated in FIG. 2. Depending on an operation mode of the measurement apparatus 1, a switching between different trained autoencoder neural networks 4 is performed automatically to use a fitting autoencoder neural network for the current measurement operation mode. In a further possible embodiment, a fitting autoencoder neural network 4 trained for the measurement operation to be performed by the measurement apparatus 1 can be loaded from a local or remote database of the measurement system. In a possible embodiment, the measurement apparatus 1 comprises a data interface which connects the measurement apparatus 1 via a data network such as the Internet to a backend system having a web server which has access to a repository or database. The remote database can store in a possible embodiment an autoencoder neural network 4 that can be loaded into the measurement apparatus 1 on request. The measurement apparatus 1 can comprise a stationary measurement apparatus 1 operating in an indoor environment but also a handheld measurement apparatus 1 operating in an outdoor environment.

LIST OF REFERENCE SIGNS 1 measurement apparatus
2 acquisition memory
3 processor
4 autoencoder neural network
4A encoder
4B decoder
5 input port
6 probe
7 analog to digital converter
8 processing stage
9 processing stage
10 processing stage
11 user interface

The invention claimed is:

1. A method for detecting signal features of a measurement signal comprising the steps of:
   providing at least two separate data sections of at least one measurement signal;
   determining a measurement parameter vector, v, for each provided data section of the measurement signal; and
   processing the measurement parameter vectors, v, as input data by a trained autoencoder neural network to detect signal features of said measurement signal.

2. The method according to claim 1 wherein an encoded vector, h, including a number of characteristic signal features of the measurement signal is derived from a middle layer of said trained autoencoder neural network.

3. The method according to claim 1 wherein a dimension of an output encoded vector, h, of said autoencoder neural network comprising the number of characteristic signal features derived from the middle layer of said autoencoder neural network is reduced to provide a vector, h', in a feature space with lower dimension.

4. The method according to claim 1 wherein the measurement signal is derived by a measurement apparatus from a device under test, DUT.

5. The method according to claim 4 wherein characteristics of data sections of the measurement signal represented in the low dimensional feature space are displayed on a screen of a user interface of said measurement apparatus.

6. The method according to claim 5 wherein data sections of the measurement signal comprising similar signal features in the low dimensional feature space are clustered to determine feature areas of similar data sections displayed on the screen of the user interface of said measurement apparatus.

7. The method according to claim 6 wherein a first kind of label is assigned to each determined feature area.

8. The method according to claim 6 wherein a second kind of label is assigned to the data section of the measurement signal based on the at least one determined feature area.

9. The method according to claim 1 wherein the measurement signal comprises an analog measurement signal acquired by a probe of a measurement apparatus digitized and stored in an acquisition memory of the measurement apparatus.

10. The method according to claim 9 wherein the digital measurement signal stored in the acquisition memory of said measurement apparatus is segmented into data sections processed to determine a measurement parameter vector, v, for each data section.

11. The method according to claim 1 wherein the autoencoder neural network is trained in an unsupervised machine learning process on the basis of applied measurement parameter vectors, v.

12. A measurement apparatus comprising:
an acquisition memory adapted to store data sections of at least one acquired measurement signal;
a processor adapted to calculate a measurement parameter vector, v, for each data section of the acquired measurement signal; and
a trained autoencoder neural network adapted to process the measurement parameter vectors, v, applied as input data to the trained autoencoder neural network to provide at a middle layer of said autoencoder neural network an encoded vector, h, with characteristic signal features of the acquired measurement signal.

13. The measurement apparatus according to claim 12 comprising at least one probe to derive the at least one analog measurement signal from a device under test, DUT, and an analog to digital converter adapted to convert the analog measurement signal into a digital signal comprising data sections stored in the acquisition memory of said measurement apparatus.

14. The measurement apparatus according to claim 12 wherein the trained autoencoder neural network comprises a variational autoencoder neural network or an adversarial autoencoder neural network.

15. The measurement apparatus according to claim 12 wherein the measurement apparatus comprises a signal analyzer.

16. A computer-implemented method for signal feature detection within at least one measurement signal,
wherein measurement parameter vectors, v, representing separate data sections of the measurement signal are processed by a trained autoencoder neural network to detect automatically characteristic signal features of the measurement signal displayed on a display of a user interface.

17. A computer-implemented software tool for signal feature detection in one or more measurement signals by processing separate data sections of each measurement signal to calculate associated measurement parameter vectors, v, applied as input data to a trained autoencoder neural network to extract characteristic signal features of the measurement signals.

* * * * *